(12) United States Patent
McNeil

(10) Patent No.: US 6,834,356 B1
(45) Date of Patent: Dec. 21, 2004

(54) FUNCTIONAL CLOCK GENERATION CONTROLLED BY JTAG EXTENSIONS

(75) Inventor: William Lloyd McNeil, Apex, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/504,973

(22) Filed: Feb. 15, 2000

(51) Int. Cl.[7] .................................................. G06F 1/04
(52) U.S. Cl. ............................ 713/501; 713/600; 716/4
(58) Field of Search ................................. 713/500, 501, 713/503, 600; 716/1, 2, 4

(56) References Cited

U.S. PATENT DOCUMENTS

| | | | |
|---|---|---|---|
| 4,701,920 A | 10/1987 | Resnick et al. | 371/25 |
| 4,726,025 A | 2/1988 | Splett et al. | 371/25 |
| RE33,461 E | 11/1990 | Splett et al. | 371/25.1 |
| 5,434,804 A | 7/1995 | Block et al. | 364/579 |
| 5,668,492 A | 9/1997 | Pedersen et al. | 327/291 |
| 5,781,558 A * | 7/1998 | Inglis et al. | 714/718 |
| 5,781,560 A | 7/1998 | Kawano et al. | 371/22.32 |
| 5,805,608 A | 9/1998 | Baeg et al. | 371/21.31 |
| 5,812,562 A | 9/1998 | Baeg | 371/22.31 |
| 5,815,692 A | 9/1998 | McDermmott | 395/556 |
| 5,894,548 A | 4/1999 | Horie | 395/183.06 |
| 5,926,053 A | 7/1999 | McDermmott | 327/298 |
| 6,014,752 A * | 1/2000 | Hao et al. | 713/500 |
| 6,286,119 B1 * | 9/2001 | Wu et al. | 714/726 |
| 6,321,329 B1 * | 11/2001 | Jaggar et al. | 712/227 |
| 6,539,491 B1 * | 3/2003 | Skergan et al. | 713/500 |
| 6,668,332 B1 * | 12/2003 | McNeil | 713/500 |

* cited by examiner

*Primary Examiner*—Dennis M. Butler
(74) *Attorney, Agent, or Firm*—Joscelyn G. Cockburn

(57) ABSTRACT

An on-chip clock generation system used the Serial Interface in an on-chip JTAG facility to write bit patterns in a shift register. The bit patterns are applied to control inputs of a clock generation circuit whose clock outputs are varied in accordance with changes to the bit patterns. By using the same facility to provide JTAG and clock functions the output clocks provided by clock generation circuit on the chip can be varied without using additional pins or the output clocks themselves.

18 Claims, 3 Drawing Sheets

PROBLEM SOLUTION

PROBLEM DESCRIPTION
ASIC (CHIP)

FUNCTIONAL CLOCK GENERATION CONTROLLED BY JTAG EXTENSIONS

RELATED APPLICATIONS

The present invention, is related to the subject matter of the following commonly assigned U.S. Pat. No. 6,668,332 issued Dec. 23, 2003, entitled "FUNCTIONAL CLOCK OBSERVATION CONTROLLED BY JTAG EXTENSIONS", which was filed concurrently with the present application, on the same day.

The content of the above-referenced copending patent application Ser. No. 09/504,367, is thus incorporated herein by reference.

TECHNICAL FIELD

The present invention relates to the problem area of clock generation circuitry, present inside a VLSI module (Chip). This clock generation circuitry needs to have control inputs that are capable of being varied in value, such that the effect that those varying values have on the clocks being generated, may be observed at the chip outputs.

BACKGROUND OF THE INVENTION AND PRIOR ART

The need and application for clock generation is ubiquitous. An exemplary, but not exclusive application can be found in a computing system wherein a processor utilizes a so-called system clock to communicate with external system devices such as DRAM, and synthesizes one or more internal clocks from the system clock to clock so-called functional units within the processor. It should be understood that a computing system is but one of many applications known to one skilled in the art.

By the way of further background, clock generation can be broadly categorized into either phase-locked loop (PLL) circuitry or delay line loop (DLL) circuitry. Pll circuitry generally takes reference signals, such as the system clock, compares it to the feedback signal, and generates an error signal in response thereto. The error signal drives a voltage controlled oscillator which produces an output signal. The output signal is also scaled to generate the feedback signal for comparison with the reference signal. The divisor setting of the divider sets the frequency ratio between the reference and output clock signals.

Although a review of the prior art related to test boundary scans was noted in the prior art, however no specific reference to the use of JTAG extensions, controlled and varied using JTAG design specific registers, was not found in any prior art reference.

SUMMARY OF INVENTION

The present invention relates to the problem area of clock generation circuitry, present inside a VLSI module (Chip). This clock generation circuitry needs to have control inputs that are capable of being varied in value, such that the effect that those varying values have on the clocks being generated, may be observed at the chip outputs. This invention solves the problem defined above by adding circuitry to part of the chip which implements IEEE Standard 1149.1 (IEEE Test Access Port and Boundary Scan Architecture, A.K.A. JTAG). Since JTAG circuitry uses clocking that is required to be independent of any other clocking domains on the chip, the requirement detailed above is met.

DETAILED DESCRIPTION OF THE PREFERRED EMBODIMENT

Before going into the detail description of the invention, it would be beneficial to define some of the acronyms employed throughout the Specifications.

ASIC This is the acronym for Application Specific Integrated Circuit.

JTAG defined as Joint Test Action Group. It is an alias for IEEE 1149.1, which is also known as IEEE Standard Test Access Port and boundary-Scan Architecture.

Pll is an acronym for Phase-Locked Loop.

VLSI is an acronym for Very Large Scale Integration.

DSR is an acronym for Design-Specific Register.

Multiplexer is a hardware circuit for selecting a single output from multiple inputs. It is a device for funneling several different streams od data over a common communications line.

Regarding the present invention, it relates to the problem area of clock generation circuitry, present inside a VLSI module (Chip). This clock generation circuitry needs to have control inputs that are capable of being varied in value, such that the effect that those varying values have on the clocks being generated, may be observed at the chip outputs.

This mechanism allows the optimum values for the clock generation control inputs to be determined by trying different input values, and observing the resulting generated clock signals in an iterative fashion.

The optimum values are the ones which cause the clock generation circuitry to produce the best quality clocks. An example of a quality measurement would be clock jitter. An example of clock generation logic that has such a requirement is a on-chip PLL circuit which has inputs which control aspects of the feedback loop in the PLL.

If the chip has spare input pins that would otherwise be unused, then providing the clock generation control inputs is a simple matter of connecting the control input to the input pins. Since this frequently is not the case it is necessary to multiplex functional chip signals with the clock signals. This allows a common set of chip output or input pins to be used for both normal functional signals, as well as the control input signals.

However, since clock signals being generated may not be operating correctly, as the control inputs are varied, it is necessary that the circuitry which provides the control inputs, be completely independent of the generated clock signals themselves.

In addition to the advantages outlined in the summary of the invention, by adding the clock control circuitry to part of the chip which implements IEEE Standard 1149.1 (IEEE Test Access Port and Boundary Scan Architecture, A.K.A. JTAG), the already existing chip input and output pins, which are used to provide the required JTAG signals, may also be used to access the clock generation control circuitry. This solves the problem without requiring any additional chip pins to be used for the clock generation control inputs.

Figure 3:
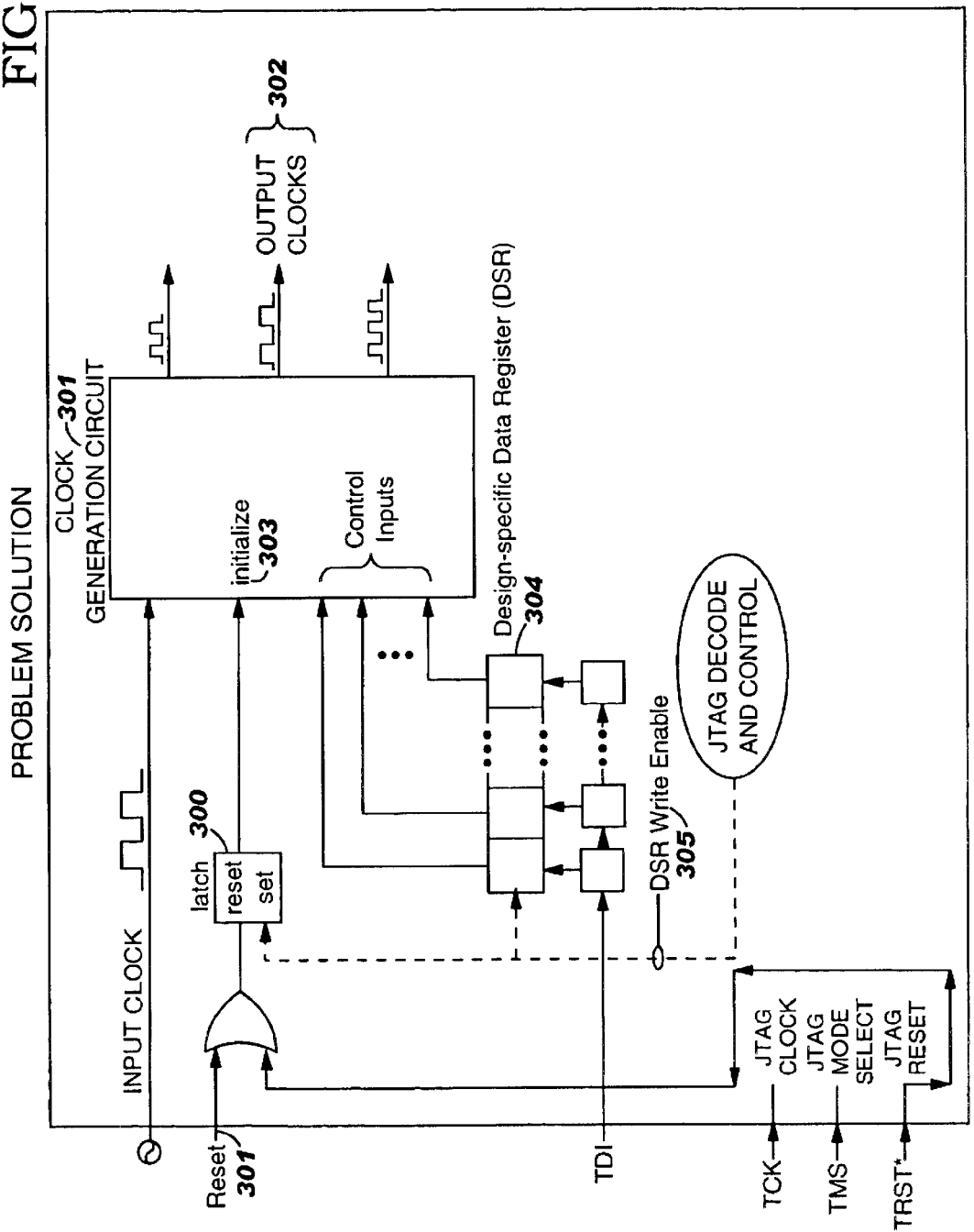
FIG. 3 shows a representation of the solution of the problem as outlined in the Summary and defined in the Description of the Invention.

The problem as noted in FIG. 3, is resolved by employing a JTAG design-specific data register (DSR). FIG. 3. at location 304, is added to the JTAG design. The outputs of this register form the set of signals used to control the clock generation circuitry. When the chip's reset input signal is asserted, DSR is reset to a set of nominal values that are the initial targeted values to cause the clock generation logic to produce good clocks.

To apply a new value to the clock inputs, a write is performed (via the JTAG interface) to the DSR with the targeted values. Any write to DSR causes the clock generation logic to perform an initialization sequence. At the end of the sequence, the clock generation logic will begin generating clocks, which may then be observed at chip outputs. Each candidate value for the clock control inputs is iterated through in the manner described above. Once the optimum setting (the one that produces the best quality clock value) is determined, the nominal value that the DSR takes on during chip functional reset is changed to be the optimum setting.

Figure 1:
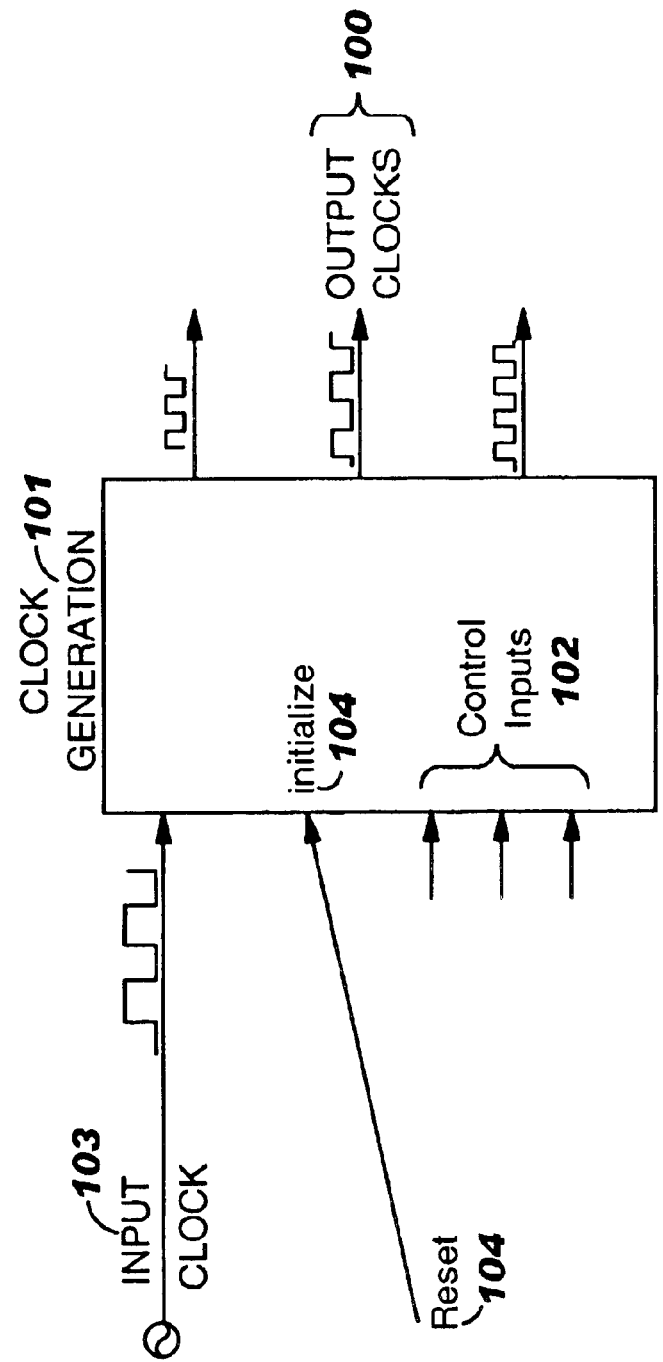
FIG. 1 This represents a description of the problem showing an ASIC (Chip).

The invention will now be illustrated by several FIGS., 1, 2 and 3. Starting with FIG. 1, which represents a problem description ASIC (Chip). The output clocks are noted at location 100, the clock generation at 101, the input clocks at location 103, the reset at 104 and the control inputs at location 102.

As noted earlier, control inputs affect quality of the output clocks, and control of the inputs 102, must not be generated as a function of the output clocks at location 100. Control inputs must be capable of being varied in an iterative fashion in order to allow affect on the output clock quality to be observed. This process may be used to empirically determine the control inputs at 102 settings which produce the most ideal output clocks. The input clock is located at 103, the reset at 104, and clock generation at 101.

Figure 2:
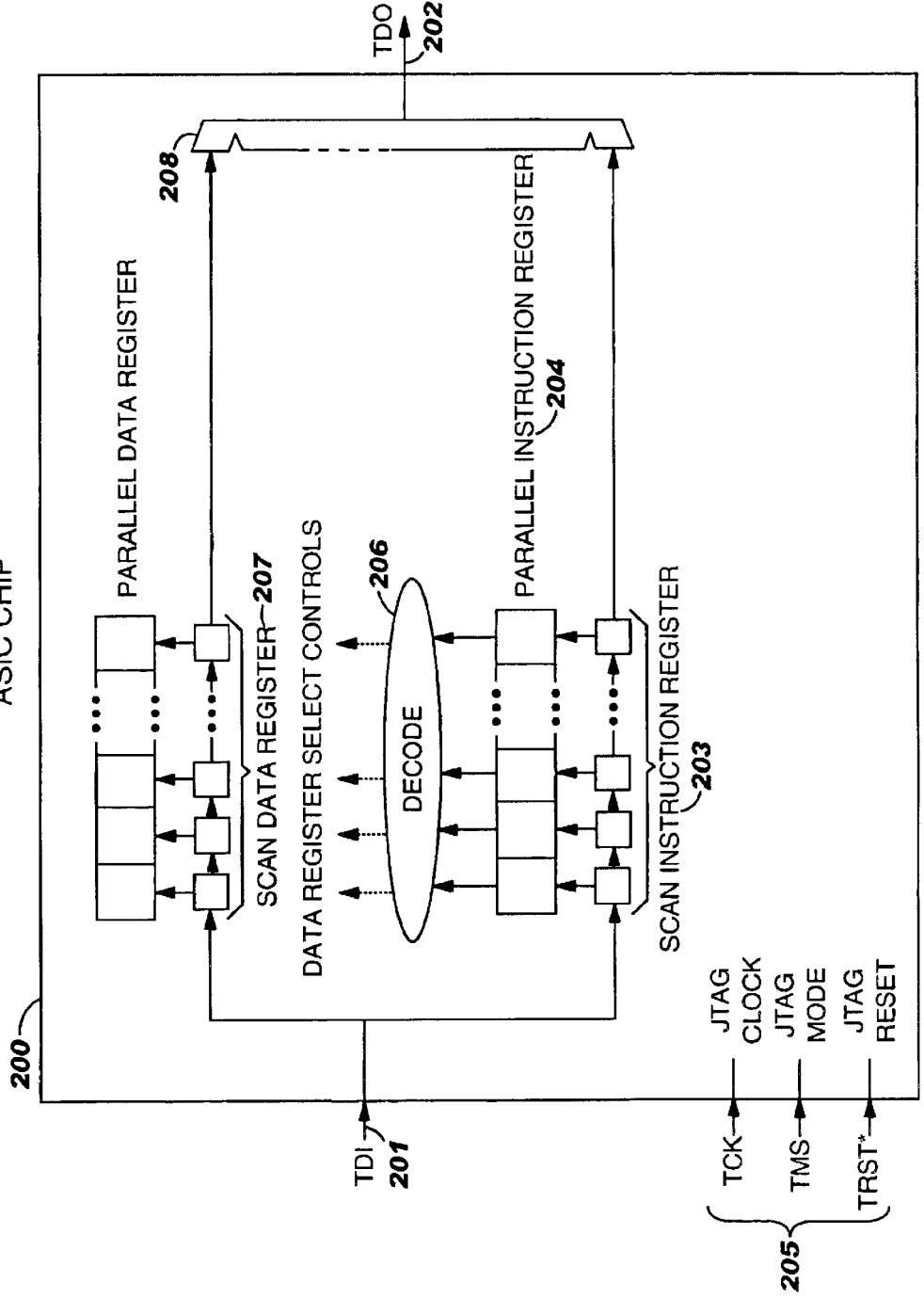
FIG. 2 shows a JTAG (IEEE 1149.1) Overview within an ASIC (Chip)

FIG. 2 Located at 200 represents a JTAG (EEE 1149.1) Overview of an ASIC CHIP. It shows the input into the chip at 201 and the output at 202. The chip shows the scan instruction register at 203, the parallel instruction register at 204. The JTAG clock, the JATG mode select and the JTAG Reset are seen at 205 respectively. The JTAG instruction decode is seen at 206, the scan data register select controls seen at 207. The multiplexor is noted at location 208.

FIG. 3 The figure represents the solution to the problem outline earlier in the Specifications. The solution is achieved without requiring any dedicated chip I/O signals. The process is performed as follows. Apply a value to the clock generator (301) control inputs by using the JTAG interface signals to write the desired pattern to the DSR at 304. Any write to the DSR causes the latch to be set at location 300. This causes the clock generation (301) logic to perform an initialization sequence at 303. Following the initialization sequence, the clock generation logic will begin to generate functional clocks. Each candidate value for the clock control inputs is iterated through using the sequence described above.

The functional chip input Reset at location 301, causes latch at 300 to reset, and chip outputs at 302, to carry clock outputs. Any write to the DSR at 305, causes the latch to be set, and the chip outputs to carry the output clocks 302. The Design Specific Register is located at 304.

While the invention has described with respect to a specific embodiment, it will be obvious to those skilled in this art that changes in both form and/or detail may be made without a departure from the scope and/or spirit of the invention.

I claim:

1. An on-chip clock generation system comprising:
   a clock generation circuit arrangement having an output interface for generating output clocks and an input interface, said input interface including an input clock port, an initialization port and control input ports;
   a design-specific data register operatively coupled to the control input ports; and
   a JTAG circuit arrangement for implementing IEEE 1149.1 standard implementated on said chip and operatively coupled to said design specific data register wherein a serial interface associated with said JTAG circuit arrangement being used to write data patterns into said specific data register.

2. The clock generation system of claim 1 wherein the output clocks vary in accordance with patterns loaded into the specific data register.

3. The clock generation system of claim 1 or claim 2 further including an oscillator to generate input clock signals operatively coupled to the input clock port.

4. The clock generation system of claim 1 further including a latch having an output operatively coupled to the initialization port of said clock generation circuit arrangement, a reset port and a set port.

5. The clock generation system of claim 4 further including a first conductor operatively coupling a first part of the JTAG circuit arrangement to the set port.

6. The clock generation system of claim 4 further including a logic circuit having an output operatively coupled to the reset port of said latch, a first input port to receive a reset signal and a second input port.

7. The clock generation system of claim 6 further including a second part of said JTAG circuit arrangement; and
   a conductor operatively coupling the second part of said JTAG circuit arrangement to the second input port of said logic circuit.

8. The clock generation system of claim 5 wherein the first part of the JTAG circuit arrangement includes JTAG decode and control.

9. The clock generation system of claim 6 wherein the logic circuit includes an OR circuit.

10. The clock generation system of claim 7 wherein the second part of said JTAG circuit arrangement includes JTAG clock, JTAG mode select and JTAG reset.

11. The on-chip clock generation system of claim 1 wherein the serial interface associated with said JTAG circuit arrangement includes a plurality of shift registers operatively coupled to the design-specific data register.

12. An on-chip clock generation system comprising:
    a clock generation circuit arrangement having an output interface for generating output clocks and an input interface, said input interface including an input clock port, an initialization port and control input ports; and
    a serial interface for loading data to control output clocks operatively coupled to the control inputs.

13. The on-chip clock generation system of claim 12 further including a design-specific data register operatively coupling the control input ports to the serial interface.

14. The on-chip clock generation system of claim 13 wherein said serial interface includes a multi-stage shift register operatively coupled to the design-specific data register.

15. A method to generate clocks on a chip comprising:
    providing on-chip circuit arrangement to generate said clocks;
    providing on said chip a JTAG circuit arrangement in accordance with IEEE 1149.1 standard;
    providing a data register to interconnect control inputs of said on-chip circuit arrangement to said JTAG circuit arrangement; and using a serial interface associated with said JTAG circuit arrangement to load data patterns that control said clocks into the data register.

16. The method of claim 15 including varying the data patterns on said serial interface to adjust the clocks.

17. The method of claim 16 further including
monitoring the clocks; and
stop varying the data patterns when optimum values for said clocks are detected.

18. The method of claim 17 further including using the pattern that produces optimum values for said clocks as optimum setting for said data register.

* * * * *